(12) United States Patent
Takahiko

(10) Patent No.: US 7,127,227 B2
(45) Date of Patent: Oct. 24, 2006

(54) DIGITAL DOWN-CONVERTER

(75) Inventor: Kishi Takahiko, Yokohama (JP)

(73) Assignee: Samsung Electronics Co., Ltd.(KR)

(*) Notice: Subject to any disclaimer, the term of this patent is extended or adjusted under 35 U.S.C. 154(b) by 494 days.

(21) Appl. No.: 09/956,653

(22) Filed: Sep. 20, 2001

(65) Prior Publication Data

US 2002/0048325 A1 Apr. 25, 2002

(30) Foreign Application Priority Data

Sep. 21, 2000 (JP) .............................. 2000-287666

(51) Int. Cl.
*H04B 1/26* (2006.01)
(52) U.S. Cl. ...................... 455/313; 455/314; 455/315
(58) Field of Classification Search ................ 455/313, 455/314, 315, 316, 318; 375/325, 261
See application file for complete search history.

(56) References Cited

U.S. PATENT DOCUMENTS

| | | | | |
|---|---|---|---|---|
| 5,375,146 A | * | 12/1994 | Chalmers | .................... 375/350 |
| 5,878,089 A | * | 3/1999 | Dapper et al. | .............. 375/325 |
| 6,308,048 B1 | * | 10/2001 | Gore et al. | ................... 455/76 |
| 6,549,544 B1 | * | 4/2003 | Kroeger et al. | ............. 370/482 |
| 6,697,603 B1 | * | 2/2004 | Lovinggood et al. | ...... 455/13.1 |

* cited by examiner

*Primary Examiner*—Melur Ramakrishnaiah
(74) *Attorney, Agent, or Firm*—Dilworth & Barrese LLP

(57) ABSTRACT

A digital down-converter having a low spurious level and a high frequency precision without increasing power consumption of a local oscillator. A first mixer receives, as a first IF input signal, a digital signal obtained by sampling a received signal with an RF signal or an IF signal, and converts the first IF input signal to a second IF signal using the first local oscillator. A digital filter suppresses an outband signal of the second IF signal provided from the first mixer. A second mixer converts an output of the digital filter to a detection process frequency using the second local oscillator. An available frequency step of the first local oscillator is larger than an available frequency step of the second local oscillator.

9 Claims, 4 Drawing Sheets

DIGITAL DOWN-CONVERTER

PRIORITY

This application claims priority to an application entitled "Digital Down-Converter" filed in the Japanese Patent Office on Sep. 21, 2000 and assigned Serial No. 2000-287666, the contents of which are hereby incorporated by reference.

BACKGROUND OF THE INVENTION

1. Field of the Invention

The present invention relates generally to a digital down-converter, and in particular, to a digital down-converter for sampling a received radio signal with a radio frequency (RF) signal or an intermediate frequency (IF) signal and then performing digital signal processing on the sampled signal.

2. Description of the Related Art

A conventional digital down-converter (DDC), such as a typical frequency down-converter for a digital signal processing circuit in a data communication receiver, will be described with reference to FIG. 1. Referring to FIG. 1, an input signal 100, such as an RF or IF modulation carrier, is an IF signal of a frequency Fif1, sampled with a frequency Fs1. For detection, the IF input signal 100 is mixed with a cosine wave c(t) and a sine wave −s(t) of a frequency Fc output from a local oscillator (LO) 102 by a mixer 101a and a mixer 101b. When the frequency Fc for the cosine wave and the sine wave, output from the local oscillator 102, is set to satisfy a relationship of Fc=Fif1, the IF input signal 100 is converted to a detection process frequency signal. The converted IF signals are subjected to 1/n down-sampling (Fs2=Fs1/n) by sampling rate converters 103a and 103b, creating baseband signals of a frequency Fb. The baseband signals are rolloff-shaped by rolloff filters 104a and 104b, and then, variably amplified by undepicted automatic gain control (AGC) amplifiers. As a result, the IF input signal is output as a complex baseband signal comprised of an in-phase component I signal and a quadrature-phase component Q signal.

As stated above, in the digital down-converter (DDC) for sampling a received signal with a radio frequency (RF) or an intermediate frequency (IF) and converting the sampled digital signal to a complex baseband signal by digital signal processing, a spurious signal generated by an operation of the local oscillator 102 used by the mixers 101a and 101b deteriorates an adjacent channel interference characteristic or an outband interference characteristic. This is because an adjacent channel or an outband signal is multiplied by the spurious signal, thus generating undesired signals outside the corresponding band.

To solve this problem, countermeasures have been taken by (1) increasing an operation precision to decrease a level of the spurious signal from the location oscillator 102 to a tolerable level, (2) adopting a dither technique to reduce a spurious peak level by spreading the spurious signal generated from the local oscillator 102, and (3) using a spurious-free frequency based on the fact that generation of the spurious signal by the local oscillator 102 depends upon an oscillation frequency of the location oscillator 102.

However, even the countermeasures for the spurious signal (1) cause an increase in circuit scale and power consumption; (2) cause an increase in circuit scale and power consumption, though less than when the measurement of decreasing the spurious level has been taken, and a deterioration in a carrier-to-noise ratio (C/N); and (3) cause the restriction of available frequencies. In particular, since the power consumption of the local oscillator 102 requiring the maximum processing speed to operate with a sampling frequency of the received signal holds a large part of the total power consumption of the digital down-converter, the increase in power consumption of the local oscillator 102 is very undesirable.

SUMMARY OF THE INVENTION

It is, therefore, an object of the present invention to provide a digital down-converter having a low spurious level and a high frequency precision without increasing the power consumption of a local oscillator.

To achieve the above and other objects, there is provided a digital down-converter comprising first and second local oscillators; a first mixer for receiving, as a first IF input signal, a digital signal obtained by sampling a received signal with an RF signal or an IF signal, and converting the first IF input signal to a second IF signal using the first local oscillator; a digital filter for suppressing an outband signal of the second IF signal provided from the first mixer; and a second mixer for converting an output of the digital filter to a detection process frequency using the second local oscillator; wherein an available frequency step of the first local oscillator is larger than an available frequency step of the second local oscillator.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
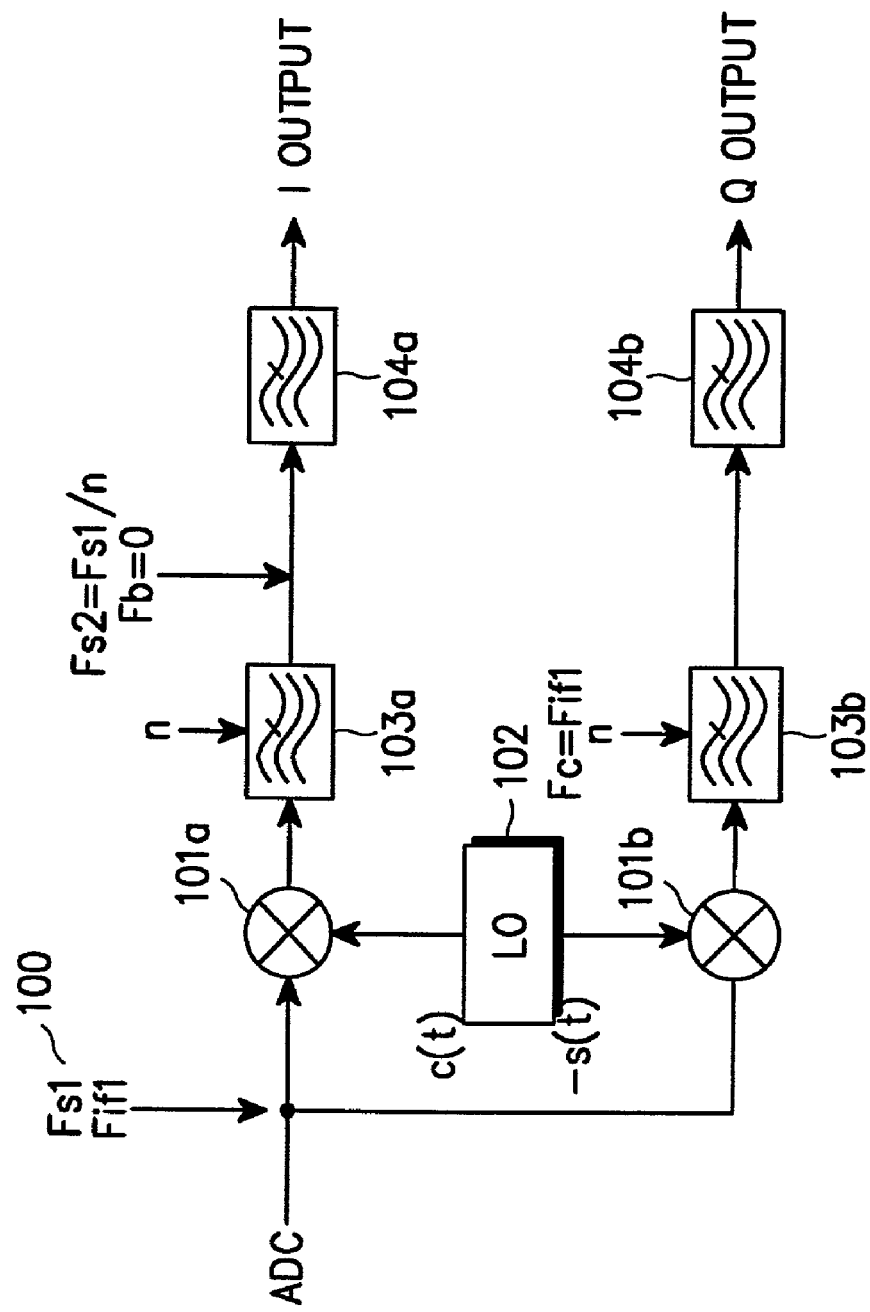
FIG. 1 is a block diagram illustrating a structure of a conventional digital down-converter.
Figure 2:
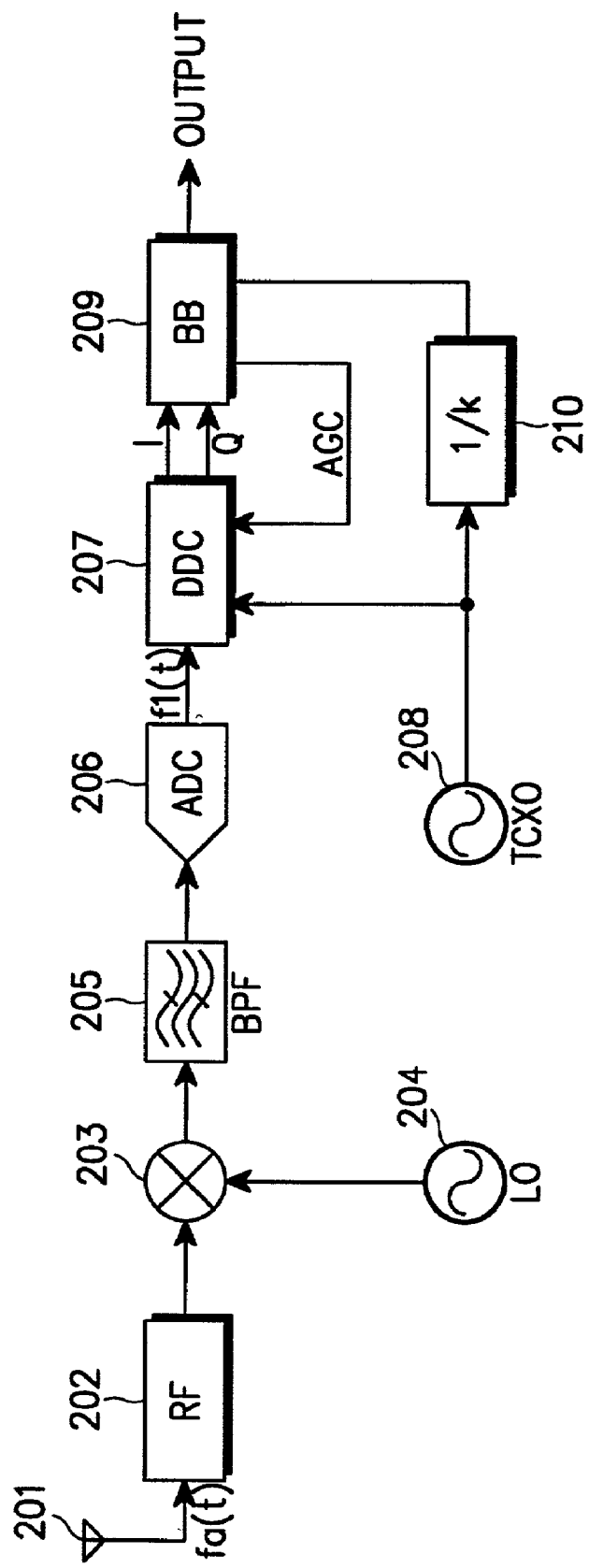
FIG. 2 is a block diagram illustrating a structure of a receiver including a digital down-converter according to an embodiment of the present invention.

FIG. 2 illustrates a receiver having a digital down-converter according to an embodiment of the present invention. In the receiver, an input signal fa(t) received through an antenna 201 is converted to an IF signal by an RF unit 202, a mixer 203 and a local oscillator (LO) 204, and then, subjected to band restriction by a bandpass filter (BPF) 205 to suppress a signal outside of a reception band. An analog-to-digital converter (ADC) 206 samples an output of the bandpass filter 205 and provides a digital down-converter (DDC) 207 with a digital IF signal f1(t) converted to a digital signal of a received signal frequency Fd1. Here, the signal f1(t) is a real signal and has a positive/negative (±) spectrum. In addition, reference numeral 208 denotes a temperature compensated crystal oscillator (TCXO), reference numeral 209 denotes a baseband circuit (BB), and reference numeral 210 denotes a 1/k frequency divider for generating a clock used by the baseband circuit 209.

Figure 3:
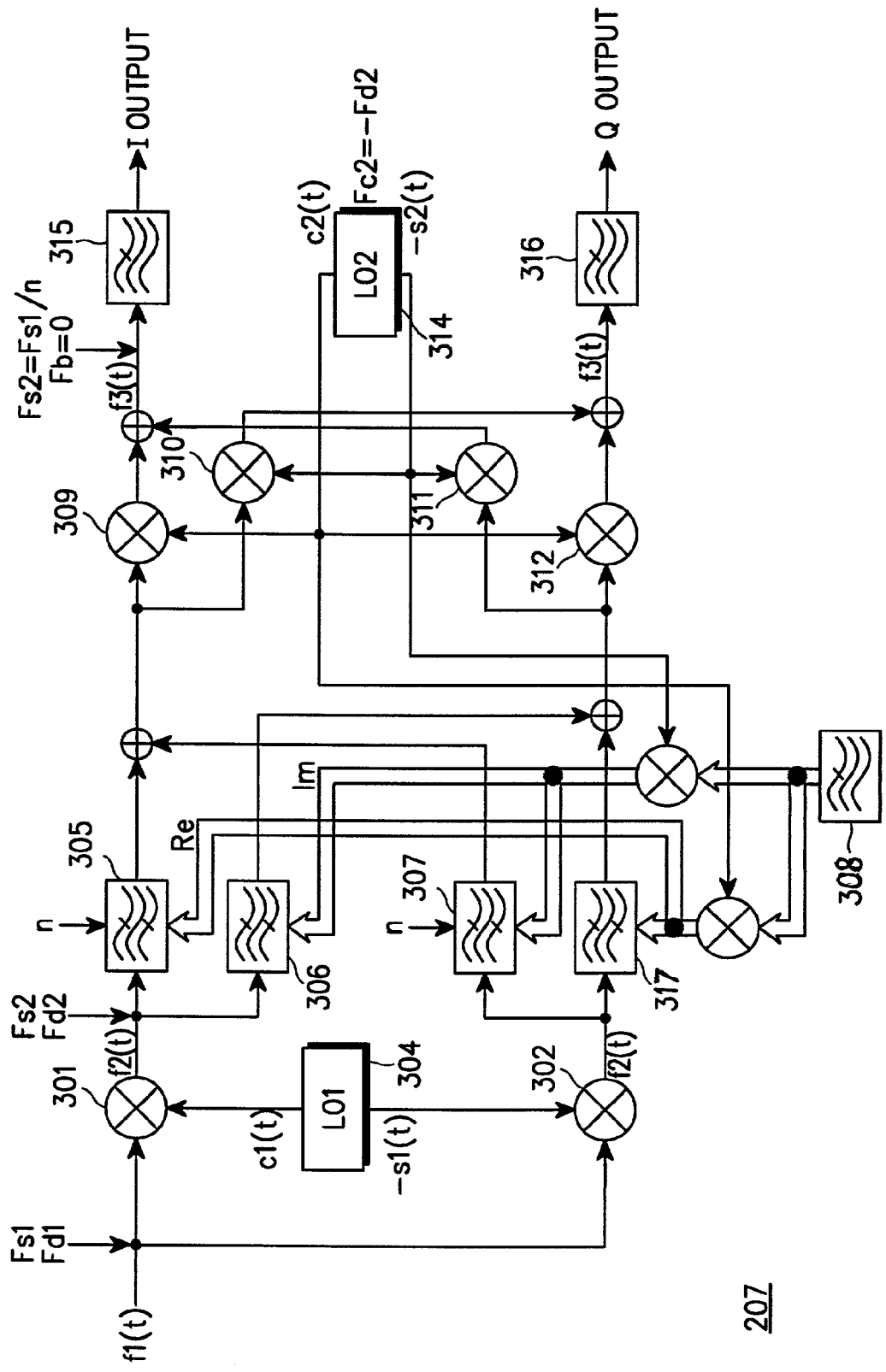
FIG. 3 is a detailed block diagram of the digital down-converter according to an embodiment of the present invention.

FIG. 3 illustrates a detailed structure of the digital down-converter 207. Referring to FIG. 3, the digital IF signal f1(t) of the received signal frequency Fd1 is applied to a first set of mixers 301 and 302 in the digital down-converter 207. The mixers 301 and 302 are quadrature converters each comprised of a multiplier. The mixers 301 and 302 multiply the signal f1(t) by local oscillation signals c1(t) and −s1(t) of frequency Fc1, respectively, output from a first local oscillator (LO1) 304, a direct digital synthesizer (DDS), thereby converting the signal f1(t) to complex IF signals f2(t) of a frequency Fd2. Here, Fc1=Fd1−Fd2.

The signals f2(t) are down-sampled to a 1/n sampling frequency Fs2 after an image frequency of the signal f1(t). An adjacent channel signal and an undesired signal caused by generation of aliasing during down-sampling are suppressed by complex coefficient-complex finite impulse response (FIR) filters 305–308, comprised of 4 FIR filters each having a BPF characteristic of a bandwidth Fbw (Fd2−Fbw/2~Fd2+Fbw/2). In other words, the FIR filters 305–308 serve as Fs2=Fs1/n decimation BPFs.

The signals f2(t) down-sampled with the sampling frequency Fs2 are multiplied by a second set of mixers 309–312, each comprised of a multiplier, by local oscillation signals c2(t) and −s2(t) of a frequency Fc2, output from a second local oscillator (LO2) 314 which is a direct digital synthesizer (DDS), converted to signals f3(t) of a baseband frequency Fb, and then, provided to the baseband circuit 209 of FIG. 2 through rolloff filters 315 and 316. Here, Fc2=−Fd2.

Coefficients of the complex coefficient-complex FIR filters 305–308 are obtained by multiplying a real coefficient of a reference lowpass filter (LPF) 317 by the complex signals c2(t) and −s2(t) from the second local oscillator 314. Alternatively, the complex coefficient-complex FIR filters 305–308 can also be comprised of polyphase filters in order to reduce operations.

Figure 4:
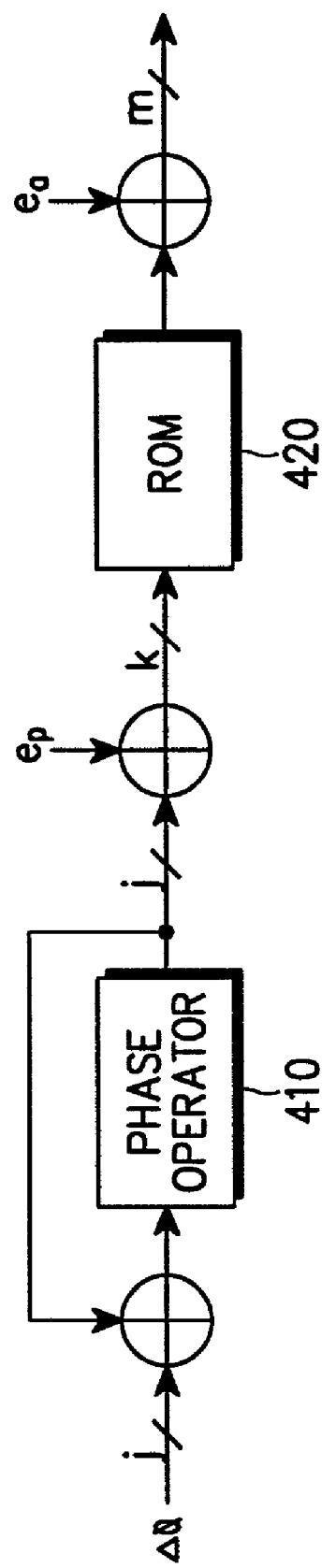
FIG. 4 is a block diagram for explaining a basic principle of a local oscillator according to an embodiment of the present invention.

FIG. 4 illustrates a basic principle of the direct digital synthesizer (DDS) applied to the digital down-converter according to the present invention. Referring to FIG. 4, the direct digital synthesizer calculates a phase of a desired frequency by a phase operator 410 comprised of a j-bit width adder (not shown) receiving j-bit width frequency data $\Delta\Phi$ and a phase register (not shown). A clipping process is not performed even though the adder overflows. Subsequently, a j-bit width output of the phase operator 410 is converted to a k-bit width, a ROM address input width, before it is provided to a ROM 420 for converting the phase value to a sine wave. A requantization error generated during the conversion of the j-bit width to the k-bit width is compensated for by adding it to a phase error $e_p$. An amplitude value output from the ROM 420 in response to the k-bit width input value has an m-bit width, and in this case, a quantization error also occurs. The quantization error is also compensated for by adding it to an amplitude error $e_a$.

A level of the spurious signals generated from the first and second local oscillators 304 and 314 each comprised of the direct digital synthesizer shown in FIG. 4, is represented by the following logical formula. That is, a carrier-to-spurious ratio (C/S) caused by the phase error is calculated by Equation (1).

$$\left(\frac{C}{S}\right) = 2^k \operatorname{sinc}\left(\frac{GCD(\Delta\Phi, 2^{j-k})}{2^{j-k}}\right), \quad GCD(\Delta\Phi, 2^j) < 2^{j-k} \quad (1)$$

where GCD(a,b) is the greatest common divisor (GCD) of 'a' and 'b', and if $GCD(\Delta\Phi, 2^j) \geq 2^{j-k}$, the phase error is $e_p=0$.

Further, a carrier-to-spurious ratio (C/S) due to the amplitude error is calculated by Equation (2).

$$\left(\frac{C}{S}\right) = 10\log_{10}\left(\frac{A^2}{2} \times \frac{12}{\Delta_A^2} \times \frac{P}{4}\right) = \left(1.76 + 6.02m + 10\log_{10}\left(\frac{P}{4}\right)\right) dBc \quad (2)$$

where $P=2^j/GCD(\Delta\Phi, 2^j)$, and P denotes a repetition period of a phase accumulator.

The aforesaid formulas are disclosed in a paper entitled "Spur reduction techniques in sine output direct digital synthesis", Proceedings of the IEEE International Frequency Control Symposium, 1996.

The present invention performs two-step frequency conversion using the first local oscillator 304 having a rough frequency step and a low spurious level, and the second local oscillator 314 having a fine frequency step and an inconsistent spurious characteristic. For the first and second local oscillators 304 and 314 outputting the sine wave and the cosine wave, the direct digital synthesizer having an excellent spurious characteristic can be used. A CORDIC, a substitute of the direct digital synthesizer, cannot simply be applied to the present invention, because a reduction in operations causes an increase in the spurious level. However, it is possible to apply the CORDIC to the second local oscillator 314. Here, the term "CORDIC" refers to Coordinate Rotation Digital Computer, also known as a digital computer for performing a trigonometrical function operation.

By sequentially reading a sine/cosine wave table, the first local oscillator 304 can operate under condition that a spurious signal caused by the phase error is not generated. The sine/cosine wave table is stored in a ROM (Read Only Memory) in which table data is registered, or registers the table data in a RAM (Random Access Memory) upon power up.

The spurious characteristic caused by the phase error of the direct digital synthesizer is improved by 6.02 dB, every time a difference (i.e., requantization error) between input word lengths (address length=ROM size) of the phase operator 410 and the ROM 420 is decreased by 1 bit. If the phase operation word length is fixed, each time the address word length of the ROM 420 is increased by 1 bit to improve the spurious characteristic, the required ROM size is doubled and the power consumption is also nearly doubled.

The spurious characteristic caused by the output word length (ROM data length) of the direct digital synthesizer is improved by 6.02 dB, each time the output word length of the direct digital synthesizer is increased by 1 bit. Even though the ROM data length is increased by 1 bit, e.g., even though an 11-bit output is changed to a 12-bit output, a ratio of a circuit scale (ROM size) to an increase in power consumption is no more than 12/11=1.091 (=1.0+0.1/LSB), showing a great difference compared with the improvement of the spurious characteristic caused by the phase error.

Since the direct digital synthesizer according to the present invention has a rough output step, even though the phase operation word length is identical to the input word length of the ROM, it is possible to sufficiently reduce the ROM address length. In addition, the direct digital synthesizer having an excellent spurious improvement effect for an increase in the ROM size can determine a spurious level by determining the output word length, making it possible to realize a low spurious level.

Therefore, when the phase operation word length of the direct digital synthesizer is identical to the input word length of the ROM, the spurious level depends on only the output word length of the direct digital synthesizer. In addition, even in the case where the phase operation word length of the direct digital synthesizer is larger than the input word length of the ROM, if a round-off error to the input word length of the ROM is not generated by setting the oscillation frequency, the spurious level depends on only the output word length of the direct digital synthesizer. Based on this, if the first local oscillator 304 uses the table reading technique (table lookup technique) as a means of simplifying the circuit, the spurious level depends on only the output word length (ROM data bit length) of the ROM, included in the table, like the direct digital synthesizer having no phase error. Here, the "table reading technique" refers to a technique of sequentially reading the sine/cosine wave table to output sine/cosine waves having no spurious signal caused by the phase error of the direct digital synthesizer.

In addition, by varying a length of the sine/cosine wave table, it is possible to vary the length in a step of the output frequency of fout=fs/3, fs/4, fs/5, . . . . Further, by registering data in a length=N table for a period M, the output frequency becomes fout=fs*(M/N). For example, the variation is available in the step of fout=fs*7/16, fs*6/16, fs*5/16, fs*4/16. Here, if N is fixed, it is possible to set the output frequency in a regular-interval step, like the direct digital synthesizer.

Meanwhile, the sampling frequency at the following stages of the second set of mixers 309–316 is decreased by decimation filtering the outputs of the first set of mixers 301 and 302, resulting in a decrease in the sampling frequency (operating frequency) of the mixers and the local oscillator in the following stages. Because of the decrease in the sampling frequency, even though the operation of the first location oscillator 304 is performed, the power consumption is reduced in proportion to the decrease in the sampling frequency. Further, the output frequency step is also subdivided in proportion to the decrease in the sampling frequency. Therefore, it is possible to reduce a frequency error, even if an oscillator having the same structure as that of the first local oscillator is used.

In addition, by fixing a bandwidth of a digital filter to a communication channel bandwidth plus the output frequency step of the first local oscillator 304, it is possible to avoid the interference caused by an undesired signal which is generated inside the band when the spurious signal from the first local oscillator 304 is multiplied by the adjacent channel or the outband spurious signal. Even though only a desired channel is passed by matching a bandwidth of the decimation filter to the channel bandwidth and the output of the second local oscillator tolerates the spurious signal, a signal-to-noise ratio and a constellation are deteriorated, and the interference due to the undesired signal cannot be avoided.

It is ideal that a bandwidth of the filter should be identical to the channel bandwidth. However, since the first local oscillator has the rough output frequency step, every received channel deviates from the center frequency of the IF frequency, generating an error. Therefore, a bandwidth of the filter is determined by spreading a center frequency band upward and downward, respectively, by ½ the output frequency step of the first local oscillator.

In light of a suppression band characteristic of the filter, interference due to the undesired signal caused by the spurious signal is proportional to the spurious level. The spurious signal, if it's level is not high, may be chiefly aimed at preventing aliasing due to the down-sampling. In other words, for the high spurious level, the suppression band of the filter is extended as far as up to the vicinity of a pass band of the filter. However, for the low spurious level, the suppression band of the filter can be limited to a band where aliasing occurs. Therefore, it is possible to obtain higher baseband attenuations with the filter having the same order as the filter having the high spurious level, resulting in an increase in aliasing suppression degree.

In the digital filter, if a desired channel deviates from the center frequency by an offset caused by the first digital oscillator 304, it is not necessary to widen the channel bandwidth of the digital filter to absorb the deviation of the IF signal from the center frequency, caused by the rough output frequency step of the first local oscillator.

In addition, by multiplying $e^{j(n\omega)}$ by an FIR filter coefficient of an LPF (real coefficient filter) characteristic having a half bandwidth of the channel bandwidth, the coefficient is complexed and at the same time, the filter band is shifted by ω, obtaining a complex bandpass filter (BPF) having twice the bandwidth of the LPF, i.e., the channel bandwidth. By utilizing this as a down-sampling filter, it is possible to obtain the results of passing only the desired channel signal and suppressing generation of aliasing due to the down-sampling. In addition, a bandpass filter (BPF) coefficient obtained by multiplying $e^{j(n\omega)}$ by an FIR filter coefficient (reference LPF coefficient) of the LPF characteristic, becomes a coefficient of a complex coefficient real/complex BPF. The "real/complex BPF" refers to a BPF in which the coefficient is a real or complex number and a signal path is a real or complex number. The reference LPF 317 can be comprised of a complex BPF. In this case, however, since multiplication for filter band shifting is subjected to complex operation, 4 new multipliers are added, so that 2 adders are required.

In addition, the frequency shift step is determined by an available step of a complex signal generator used for frequency shifting. It is also possible to obtain a filter deviating from the center frequency by an offset caused by the first local oscillator, for every channel. In this case, it is not necessary to add a frequency error of the first local oscillator to a bandwidth of the complex FIR filter.

When a baseband attenuation of the filter is not enough to prevent aliasing due to the down-sampling, it is preferable to use a decimation filter for a filter obtained by combining real coefficient filters having a large attenuation at a point where aliasing occurs during the down-sampling.

In addition, even by using the local oscillator for $e^{j(n\omega)}$ multiplied by the reference LPF coefficient, it is possible to obtain a complex BPF coefficient for the complex coefficient FIR filter.

As described above, the present invention performs a two-step frequency conversion using the first local oscillator having a rough frequency step and a low spurious level, and the second local oscillator having a fine frequency step and an inconsistent spurious characteristic, contributing to a reduction in circuit scale and power consumption, especially power consumption of the local oscillator. As a result, it is possible to provide a digital down-converter having a low spurious level, a high frequency conversion precession and low carrier-to-noise ratio (C/N) degradation.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A digital down-converter comprising:

first and second local oscillators for outputting a sine wave and a cosine wave, the first and second local oscillators being direct digital synthesizers wherein a phase operation word length of the direct digital synthesizer corresponding to the first local oscillator is identical to an input word length of a sine/cosine wave table for converting phase data to sine and cosine waves;

a first mixer for receiving, as a first IF (Intermediate Frequency) input signal, a digital signal obtained by sampling a received signal with an RF (Radio Frequency) signal or a separate IF signal, and converting the first IF input signal to a second IF signal using the first local oscillator;

a digital filter for suppressing an outband signal of the second IF signal provided from the first mixer; and a second mixer for converting an output of the digital filter to a detection process frequency using the second local oscillator;

wherein an available frequency step of the first local oscillator is larger than an available frequency step of the second local oscillator.

2. The digital down-converter as claimed in claim 1, wherein the first local oscillator sequentially reads the sine/cosine wave table for converting the phase data to sine/cosine waves.

3. The digital down-converter as claimed in claim 2, wherein a length of the sine/cosine wave table is variable.

4. The digital down-converter as claimed in claim 3, wherein the sine/cosine wave table has data of an M period.

5. The digital down-converter as claimed in claim 1, wherein the digital filter is a decimation filter for decreasing a sampling frequency at following stages of the second mixer.

6. A digital down-converter comprising:

first and second local oscillators;

a first mixer for receiving, as a first IF (Intermediate Frequency) input signal, a digital signal obtained by sampling a received signal with an RF (Radio Frequency) signal or a separate IF signal, and converting the first IF input signal to a second IF signal using the first local oscillator;

a digital filter for suppressing an outband signal of the second IF signal provided from the first mixer; and a second mixer for converting an output of the digital filter to a detection process frequency using the second local oscillator;

wherein an available frequency step of the first local oscillator is larger than an available frequency step of the second local oscillator and a bandwidth of the digital filter is equal to a communication channel bandwidth plus an output frequency step of the first local oscillator.

7. The digital down-converter as claimed in claim 6, wherein the digital filter is an FIR (Finite Impulse Response) filter, and for frequency setting of the digital down-converter, $e^{j(n\omega)}$ is multiplied by a lowpass filter coefficient having a half bandwidth of the communication channel bandwidth.

8. The digital down-converter as claimed in claim 7, wherein the value $e^{j(n\omega)}$ multiplied by the lowpass filter coefficient is obtained using the first local oscillator.

9. A digital down-converter comprising:

a first local oscillator having a rough frequency step and a low spurious level, said spurious level corresponding to an output word length;

a second local oscillator having a fine frequency step and an inconsistent spurious characteristic;

a first mixer for receiving a digital signal and converting the digital signal to a second IF signal using the first local oscillator, the digital signal being a first IF (Intermediate Frequency) input signal and being obtained by sampling a received signal with one of an RF (Radio Frequency) signal and a separate IF signal;

a digital filter for suppressing an outband signal of the second IF signal provided from the first mixer; and a second mixer for converting an output of the digital filter to a detection process frequency using the second local oscillator;

wherein an available frequency step of the first local oscillator is larger than an available frequency step of the second local oscillator.

* * * * *